United States Patent
Furubeppu et al.

(10) Patent No.: US 6,634,002 B1
(45) Date of Patent: Oct. 14, 2003

(54) TEST CIRCUIT OF SEMICONDUCTOR MEMORY

(75) Inventors: Seizoh Furubeppu, Tokyo (JP); Takashi Hirosawa, Tokyo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 471 days.

(21) Appl. No.: 09/669,570

(22) Filed: Sep. 26, 2000

(30) Foreign Application Priority Data

Apr. 7, 2000 (JP) .......................................... 2000-106681

(51) Int. Cl.$^7$ ................................................. H02H 3/05
(52) U.S. Cl. ................................. 714/42; 257/E 21.526; 710/52; 711/170; 324/765
(58) Field of Search ............................. 714/42; 711/105, 711/155, 170, 305; 710/52; 327/319; 365/189.05, 230.08, 230.06, 233; 257/E 21.526; 369/47.32; 324/765

(56) References Cited

U.S. PATENT DOCUMENTS

| | | | | |
|---|---|---|---|---|
| 5,353,254 A | * | 10/1994 | Sakamoto | 365/201 |
| 5,450,364 A | * | 9/1995 | Stephens et al. | 365/222 |
| 5,627,478 A | * | 5/1997 | Habersetzer et al. | 324/763 |
| 5,757,705 A | * | 5/1998 | Manning | 365/201 |
| 6,014,341 A | * | 1/2000 | Koshikawa | 365/233 |
| 6,061,285 A | * | 5/2000 | Tsukikawa | 365/201 |
| 6,237,122 B1 | * | 5/2001 | Maki | 714/730 |
| 6,252,820 B1 | * | 6/2001 | Nakamura | 365/233 |
| 6,411,116 B1 | * | 6/2002 | DeHaven et al. | 324/765 |

FOREIGN PATENT DOCUMENTS

| | | |
|---|---|---|
| JP | 11-297097 | 10/1999 |
| JP | 11-306797 | 11/1999 |

* cited by examiner

*Primary Examiner*—Robert Beausoliel
*Assistant Examiner*—Rita A Ziemer
(74) *Attorney, Agent, or Firm*—Burns, Doane, Swecker & Mathis, LLP (57) ABSTRACT

An internal clock signal, of which a pulse repetition period is half of that of an external clock signal, is produced in a test circuit from the external clock signal and an external clock enabling signal of which a phase is shifted from that of the external clock signal by ¼ of the pulse repetition period of the external clock signal. When an external write command signal set to a low level is received in the test circuit, an internal write command signal, of which a level is risen up in synchronization with a leading edge of the external clock signal, is produced, and a first pre-charge signal, of which a level is risen up in synchronization with a trailing edge of the internal clock signal obtained just after the leading edge of the external clock signal, is produced. Therefore a write recovery time-period equal to ¼ of the pulse repetition period of the external clock signal is obtained from the internal write command signal and the first pre-charge signal. Accordingly, even though a low frequency external clock signal is used in a wafer test, an operational performance of a memory cell array can be tested in the recovery time-period shorter than the pulse repetition period of the external clock signal to judge whether or not the operational performance of the memory cell array satisfies specification required of a semiconductor memory.

7 Claims, 8 Drawing Sheets

TEST CIRCUIT OF SEMICONDUCTOR MEMORY

BACKGROUND OF THE INVENTION

1. Field of the Invention

The present invention relates to a test circuit in which a wafer test is performed for a semiconductor memory by using an external clock signal having a pulse repetition period longer than that of a clock signal actually used in a normal operation of the semiconductor memory.

2. Description of Related Art

A test circuit is generally used for a wafer test of a semiconductor integrated circuit such as a semiconductor memory or the like. In the test circuit, a low frequency clock signal having a pulse repetition period longer than that of a clock signal, which is actually used to perform a normal operation of the semiconductor integrated circuit, is used. Therefore, an operational performance of the semiconductor integrated circuit is tested by using the external clock signal having a pulse repetition period longer than that of a clock signal actually used in a normal operation of the semiconductor integrated circuit. A conventional test circuit of a synchronous dynamic random access memory (SDRAM) representing a semiconductor memory is described with reference to FIG. 8 and FIG. 9.

Figure 8:
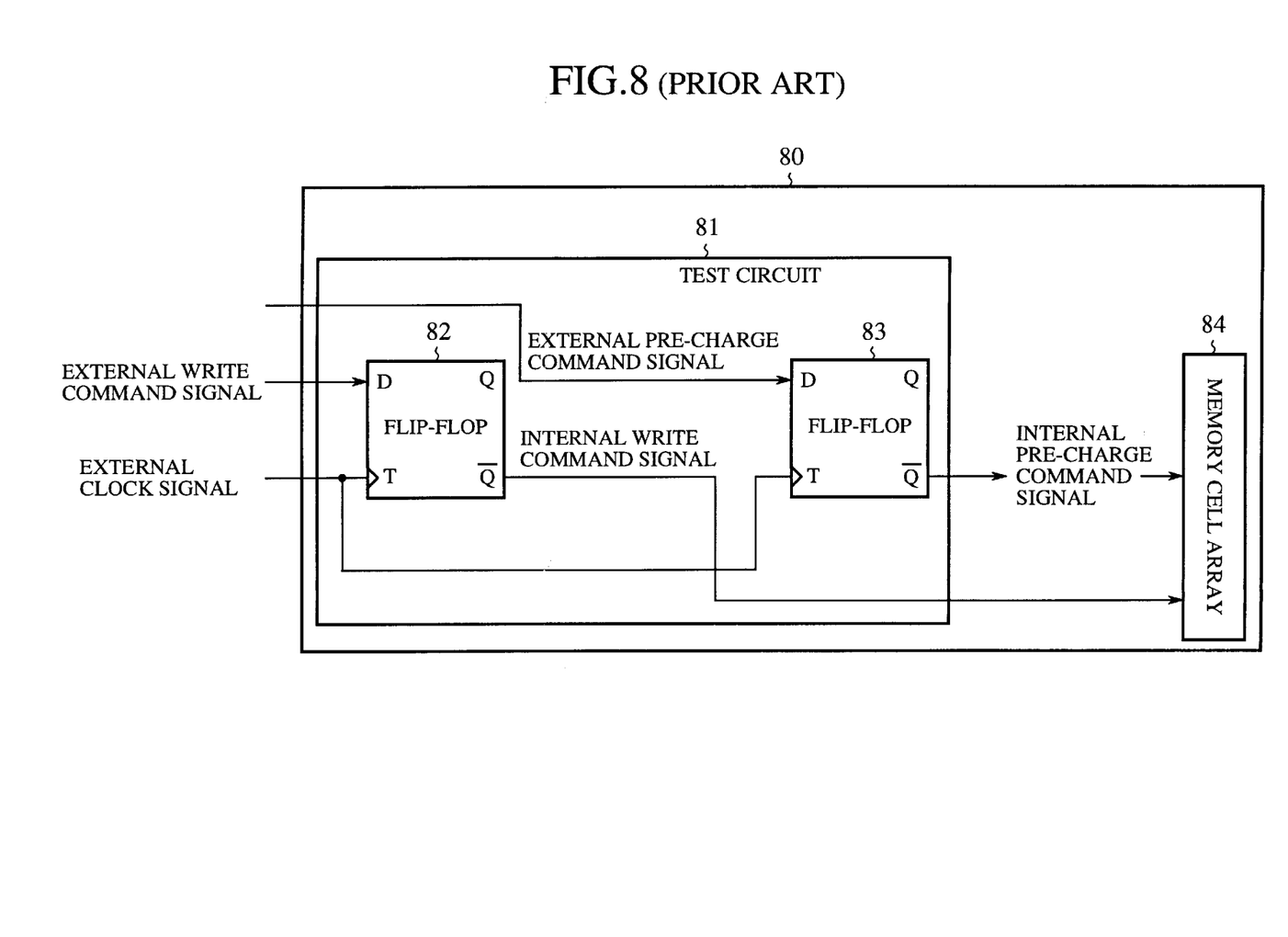
FIG. 8 is a block diagram of an SDRAM having a conventional test circuit.

FIG. 8 is a block diagram of an SDRAM having a conventional test circuit. In FIG. 8, 80 indicates an SDRAM. 81 indicates a conventional test circuit of the SDRAM 80. 82 indicates a flip-flop of the conventional test circuit 81. In the flip-flop 82, an internal write command signal is produced from an external write command signal and an external clock signal. 83 indicates a flip-flop of the conventional test circuit 81. In the flip-flop 83, an internal pre-charge command signal is produced from an external pre-charge command signal and the external clock signal. 84 indicates a memory cell array of the SDRAM 80. In the memory cell array 84, an operation test is performed in a write recovery time-period determined by both the internal write command signal produced in the flip-flop 82 and the internal pre-charge command signal produced in the flip-flop 83.

A wafer test operation of the SDRAM 80 performed by the conventional test circuit 81 is described.

Figure 9:
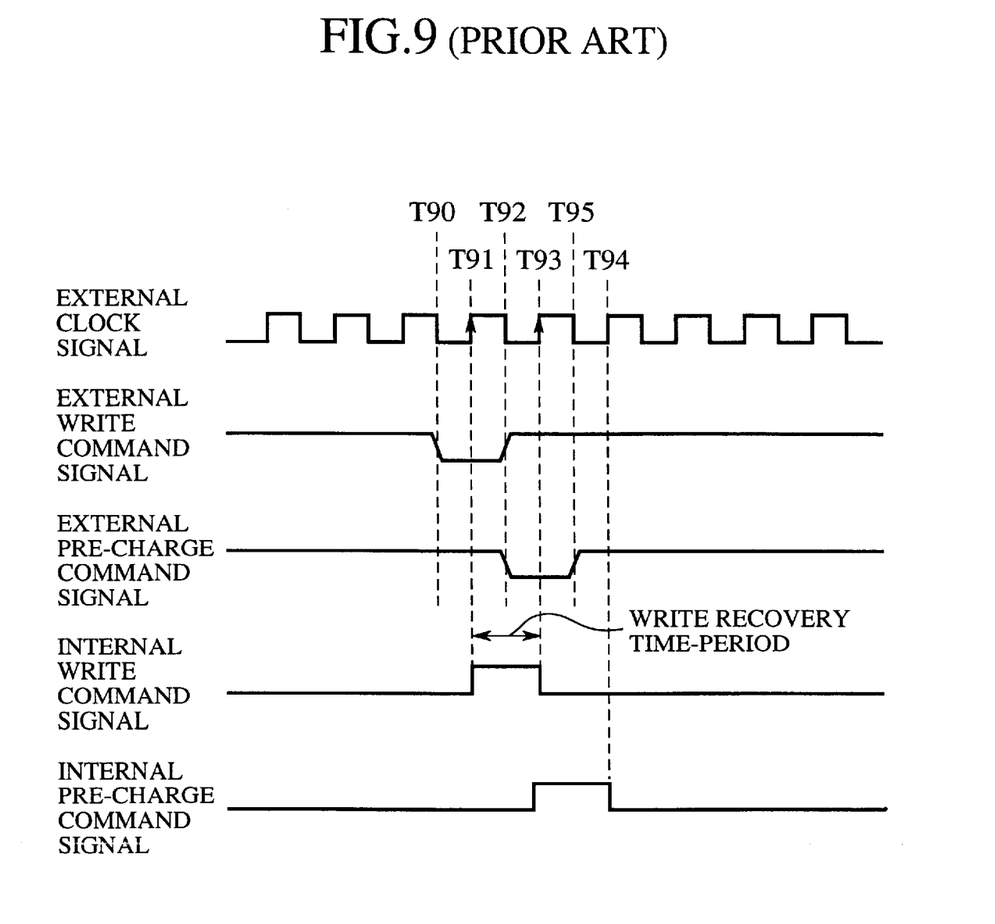
FIG. 9 is a timing chart showing an operation of the conventional test circuit shown in FIG. 8.

FIG. 9 is a timing chart showing an operation of the conventional test circuit 81. As shown in FIG. 9, an external write command signal and an external clock signal transmitted from a tester (not shown) are received in the flip-flop 82. In the flip-flop 82, an internal write command signal is set to a high level at a time T91 in synchronization with a leading edge of a pulse of the external clock signal in a time-period (from a time T90 to a time T92) in which the level of the external write command signal is set to a low level, and the level of the internal write command signal is changed to a low level at a time T93 in synchronization with a leading edge of a next pulse of the external clock signal in a time-period (after the time T92) in which the level of the external write command signal is set to a high level. Because the low level time-period of the external write command signal is equal to the pulse repetition period of the external clock signal, the internal write command signal is set to the high level during a time-period (from the time T91 to the T93) equal to the pulse repetition period of the external clock signal. The internal write command signal is transmitted from the flip-flop 82 to the memory cell array 84.

Also, the external clock signal and an external pre-charge command signal transmitted from the tester are received in the flip-flop 83. The external pre-charge command signal is set to a low level during a time-period (from the time T92 to a time T95) which is equal to the pulse repetition period of the external clock signal and is later than the low level time-period of the external write command signal by the pulse repetition period of the external clock signal. In the flip-flop 83, an internal pre-charge command signal is set to a high level at the time T93 in synchronization with a leading edge of a pulse of the external clock signal in the time-period (from the time T92 to a time T95) in which the level of the external pre-charge command signal is set to a low level, and the level of the internal pre-charge command signal is changed to a low level at the time T94 in synchronization with a leading edge of a next pulse of the external clock signal in a time-period (after the time T95) in which the level of the external pre-charge command signal is set to a high level. The internal pre-charge command signal is transmitted from the flip-flop 83 to the memory cell-array 84.

In the memory cell array 84, an operation test of memory cells is performed in a write recovery time-period (from the time T91 to the time T93) determined by a leading edge of the internal write command signal and a leading edge of the internal pre-charge command signal. Therefore, the write recovery time-period depends on the pulse repetition period of the external clock signal.

However, because the pulse repetition period of the external clock signal is longer than that of a clock signal which is actually used in a normal operation of a semiconductor memory represented by the SDRAM 80, an operational performance of the semiconductor memory cannot be reliably tested. Therefore the judgment whether or not an operational performance of the semiconductor memory satisfies specifications required of the semiconductor memory cannot be performed in a wafer test. Therefore the judgment is performed in a final test when the semiconductor memory is packaged, and a semiconductor memory not satisfying the specifications required of the semiconductor memory is abandoned. Therefore there is drawbacks that the test performed for the semiconductor memory is troublesome and the semiconductor memory cannot be manufactured at a low cost.

SUMMARY OF THE INVENTION

An object of the present invention is to provide, with due consideration to the drawbacks of the conventional test circuit, a test circuit of a semiconductor memory in which the judgment whether or not an operational performance of the semiconductor memory satisfies specifications required of the semiconductor memory is reliably performed in a wafer test even though an external clock signal having a pulse repetition period longer than that of a clock signal, which is used to operate the semiconductor memory while satisfying the specifications, is used in the wafer test.

The object is achieved by the provision of a test circuit of a semiconductor memory, comprising internal clock enabling signal producing means for producing an internal clock enabling signal set to a first level from a first write recovery test signal set to the first level and an external clock enabling signal, of which a phase is shifted from that of an external clock signal by ½L (L is a positive integer higher than 1) of a pulse repetition period of the external clock signal or which is set to a second level; internal clock signal producing means for producing an internal clock signal, of which a pulse repetition period is, 1/N (N is a positive integer, and N=L for the positive integer higher than 1) of the pulse repetition period of the external clock signal, from the internal clock enabling signal produced by the internal clock enabling signal producing means, the external clock signal, the first write recovery test signal set to the first level and the external clock enabling signal; internal write command signal and internal pre-charge signal producing means for producing an internal write command signal and a first pre-charge signal, of which a leading edge is shifted from that of the internal write command signal by ½N of the pulse repetition period of the external clock signal, from the internal clock signal produced by the internal clock signal producing means, an external write command signal set to the second level, the first write recovery test signal set to the first level and the external clock signal; and a first selector for outputting the first pre-charge signal produced by the internal write command signal and internal pre-charge signal producing means to a memory cell array as an internal pre-charge command signal to test an operational performance of the memory cell array according to a write recovery time-period which is determined from the internal pre-charge command signal and the internal write command signal produced by the internal write command signal and internal pre-charge signal producing means and is equal to ½N of the pulse repetition period of the external clock signal.

In the above configuration, a write recovery time-period shorter than the pulse repetition period of the external clock signal is prepared from the first pre-charge signal and the internal write command signal produced in the test circuit comprising the internal clock enabling signal producing means, the internal clock signal producing means, the internal write command signal and internal pre-charge signal producing means and the first selector.

Accordingly, even though an external clock signal having a pulse repetition period longer than that of a specific clock signal, which is used to operate the semiconductor memory while satisfying specifications required of the semiconductor memory, is used in a wafer test because a cheap tester generates only the external clock signal having the pulse repetition period longer than that of the specific clock signal, an internal clock signal having a pulse repetition period equivalent to that of the specific clock signal can be easily produced. Therefore the judgment whether or not an operational performance of the semiconductor memory satisfies the specifications can be reliably performed in the wafer test, and a semiconductor memory not satisfying the specifications required of the semiconductor memory can be abandoned.

Also, because it can be judged in the wafer test whether or not the operational performance of the semiconductor memory satisfies the specifications, the specification test of the semiconductor memory in a final test can be omitted. Therefore, a test cost of the semiconductor memory can be reduced.

It is preferred that the internal clock signal producing means comprises a first AND gate for producing a first AND gate signal, of which the phase is the same as that of the external clock enabling signal, from the first write recovery test signal and the external clock enabling signal of which the phase is shifted from that of the external clock signal by ¼ of the pulse repetition period of the external clock signal or which is set to the second level; an EXOR gate for producing an EXOR gate signal, of which a pulse repetition period is half of that of the external clock signal or of which the phase is the same as that of the external clock signal, from the first AND gate signal produced in the first AND gate and the external clock signal; and a second AND gate for producing the internal clock signal, of which a pulse repetition period is half of that of the external clock signal or of which the phase is the same as that of the external clock signal, from the EXOR gate signal produced in the EXOR gate and the internal clock enabling signal.

In the above configuration, the internal clock signal, of which a pulse repetition period is half (corresponding to N=2) of that of the external clock signal or of which the phase is the same (corresponding to N=1) as that of the external clock signal, can be reliably obtained.

It is also preferred that the internal clock enabling signal producing means comprises an NOR gate for producing an NOR gate signal, which is set to the second level, from the first write recovery test signal and a reset signal; and a first flip-flop for receiving the NOR gate signal produced in the NOR gate as a set signal and producing the internal clock enabling signal, which is set to the first level, from the set signal, the external clock enabling signal and the external clock signal.

In the above configuration, the internal clock enabling signal, which is set to the first level, can be reliably produced.

It is also preferred that the internal write command signal and internal pre-charge signal producing means comprises a second flip-flop for producing the internal write command signal from the external write command and the external clock signal; a third AND gate for producing a third AND gate signal from the internal write command signal produced in the second flip-flop and the first write recovery test signal set to the first level; and a third flip-flop for producing the first pre-charge signal from the third AND gate signal produced in the third AND gate and the internal clock signal.

In the above configuration, the internal write command signal and the first pre-charge signal can be reliably produced.

It is also preferred that the test circuit further comprises second control means for producing a second pre-charge signal, of which a leading edge is shifted from that of the internal write command signal by K/2N (K is a positive integer high than 1, and K<2N) of the pulse repetition period of the external clock signal, from the internal clock signal produced by the internal clock signal producing means and the first pre-charge signal produced by the internal write command signal and internal pre-charge signal producing means, wherein the first selector selects either the first pre-charge signal or the second pre-charge signal as the internal pre-charge command signal to test the operational performance of the memory cell array according to a write recovery time-period which is determined from the internal pre-charge command signal and the internal write command signal produced by the internal write command signal and internal pre-charge signal producing means and is equal to M/2N (M is a positive integer, and M<2N) of the pulse repetition period of the external clock signal.

In the above configuration, because the first pre-charge signal or the second pre-charge signal is output to the memory cell array as the internal pre-charge command signal, a write recovery time-period, which is equal to M/2N of the pulse repetition period of the external clock signal, can be determined, and the operational performance of the memory cell array can be tested according to the write recovery time-period.

It is also preferred that the second control means comprises a flip-flop for producing the second pre-charge signal, of which a leading edge is shifted from that of the internal write command signal by ¾ of the pulse repetition period of the external clock signal, from the internal clock signal, of which a pulse repetition period is half of that of the external clock signal, and the first pre-charge signal of which a leading edge is shifted from that of the internal write command signal by ¼ of the pulse repetition period of the external clock signal; and a second selector for selecting either the first pre-charge signal produced by the internal write command signal and internal pre-charge signal producing means or the second pre-charge signal produced in the flip-flop according to a second write recovery test signal, wherein the first selector selects the first pre-charge signal or the second pre-charge signal selected in the second selector as the internal pre-charge command signal according to the first write recovery test signal to test the operational performance of the memory cell array according to a write recovery time-period which is determined from the internal pre-charge command signal and the internal write command signal produced by the internal write command signal and internal pre-charge signal producing means and is equal to ¼ or ¾ of the pulse repetition period of the external clock signal.

In the above configuration, the second pre-charge signal is produced in the flip-flop, and the first pre-charge signal or the second pre-charge signal is selected in the second selector. In cases where the first pre-charge signal selected in the second selector is output to the memory cell array as the internal pre-charge command signal, the operational performance of the memory cell array can be tested in the write recovery time-period equal to ¼ of the pulse repetition period of the external clock signal. Also, in cases where the second pre-charge signal selected in the second selector is output to the memory cell array as the internal pre-charge command signal, the operational performance of the memory cell array can be tested in the write recovery time-period equal to ¾ of the pulse repetition period of the external clock signal.

It is also preferred that the internal clock signal, of which the phase is the same as that of the external clock signal, is produced by the internal clock signal producing means in cases where the external clock enabling signal set to the second level is input to the internal clock signal producing means, the level of the internal write command signal produced by the internal write command signal and internal pre-charge signal producing means is risen up in synchronization with a leading edge of the external clock signal, the level of the first pre-charge signal produced by the internal write command signal and internal pre-charge signal producing means is risen up in synchronization with a trailing edge of the internal clock signal to set a time difference in the leading edges between the first pre-charge signal and the internal write command signal to ½ of the pulse repetition period of the external clock signal, and the operational performance of the memory cell array is tested according to the write recovery time-period equal to ½ of the pulse repetition period of the external clock signal.

In cases where the external clock enabling signal is set to the second level, the internal clock signal, of which the phase is the same as that of the external clock signal, is produced. Therefore, the write recovery time-period is equal to ½ of the pulse repetition period of the external clock signal, and the operational performance of the memory cell array is tested in this write recovery time-period.

DETAILED DESCRIPTION OF THE PREFERRED EMBODIMENTS

The invention will now be described with reference to the accompanying drawings.

EMBODIMENT 1

Figure 1:
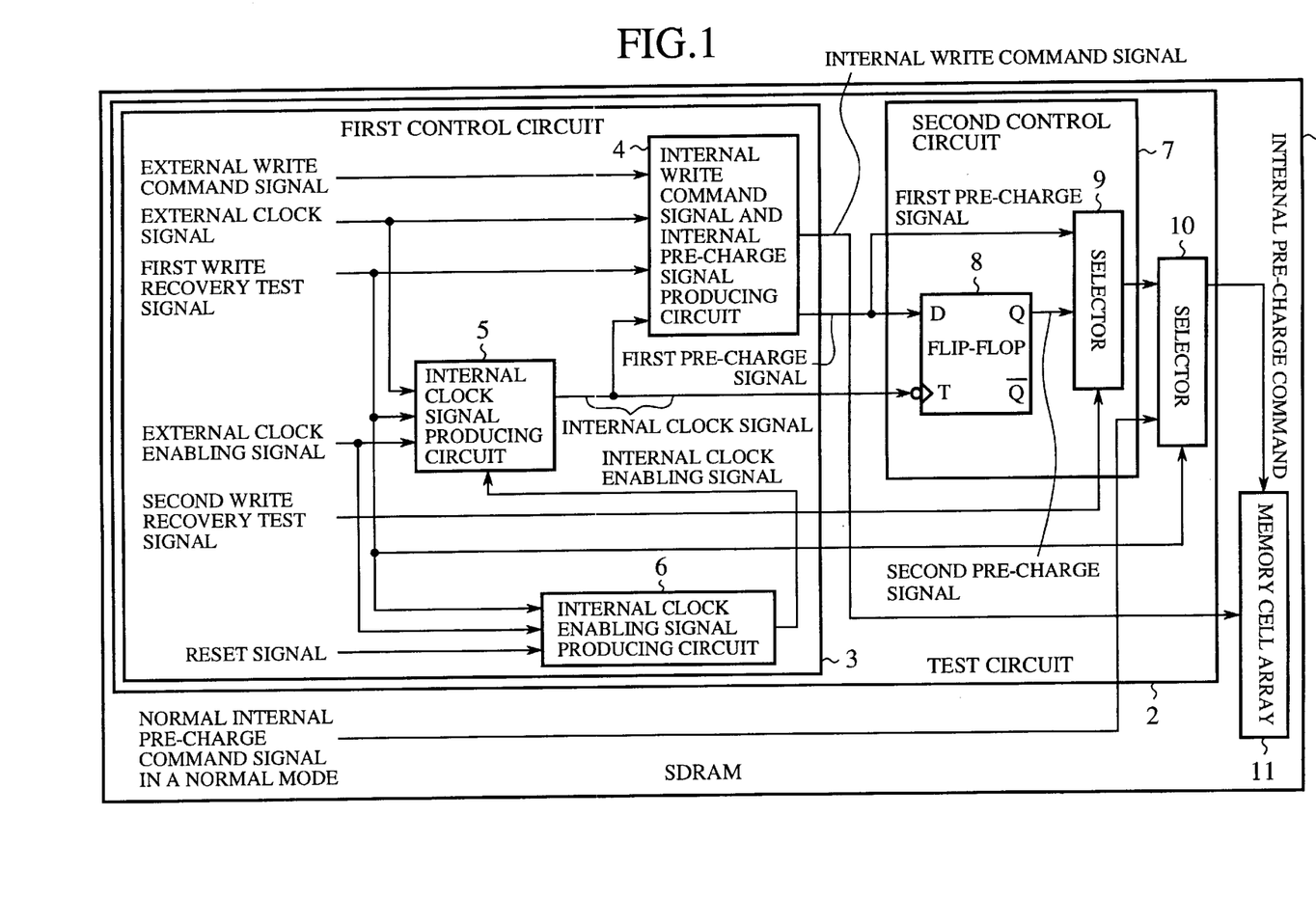
FIG. 1 is a block diagram of a semiconductor memory having a test circuit according to a first embodiment of the present invention.

FIG. 1 is a block diagram of a semiconductor memory having a test circuit according to a first embodiment of the present invention. In FIG. 1, 1 indicates an SDRAM representing a semiconductor memory. 2 indicates a test circuit for outputting an internal write command signal and an internal pre-charge command signal. 11 indicates a memory cell array of the SDRAM 1. In the memory cell array 11, a write operation is performed as a wafer test in synchronization with a leading edge of the internal write command signal output from the test circuit 2, and a pre-charge operation is performed as the wafer test in synchronization with a leading edge of the internal pre-charge command signal. 3 indicates a first control circuit of the test circuit 2. In the first control circuit 3, the internal write command signal, an internal clock signal and a first pre-charge signal are produced. A pulse repetition period of the internal clock signal is controlled to be half of that of the external clock signal, or the internal clock signal is controlled to have the same phase as that of the external clock signal. A leading edge of the first pre-charge signal is controlled to be later than a leading edge of the internal write command signal by ¼ or ½ of a pulse repetition period of an external clock signal. 7 indicates a second control circuit of the test circuit 2. In the second control circuit 7, the first pre-charge signal or a second pre-charge signal is selected as a candidate for the internal pre-charge command signal. A leading edge of the second pre-charge signal is later than the leading edge of the internal write command signal by ¾ of the pulse repetition period of the external clock signal. 10 indicate a first selector of the test circuit 2. In the first selector 10, the pre-charge signal output from the second control circuit 7 or a normal internal pre-charge command signal used in the SDRAM 1 in a normal mode is selected as the internal pre-charge command signal according to a first write recovery test signal. In cases where a wafer test is performed for the SDRAM 1, the first write recovery test signal is set to a high level, and the pre-charge signal output from the second control circuit 7 is selected in the first selector 10. In contrast, in cases where a normal operation of the SDRAM 1 is performed, the first write recovery test signal is set to a low level, and the normal internal pre-charge command signal is selected in the first selector 10.

Also, 6 indicates an internal clock enabling signal producing circuit of the first control circuit 3. In the internal clock enabling signal producing circuit 6, an internal clock enabling signal is produced from the first write recovery test signal, an external clock enabling signal and a reset signal. The external clock enabling signal is input from a tester (not shown) to the first control circuit 3 through an input pin of the external clock enabling signal in the wafer test. The external clock enabling signal is also input to the SDRAM 1 through the input pin in a normal operation of the SDRAM 1. A phase of the external clock enabling signal is shifted from that of the external clock signal by ¼ of the pulse repetition period of the external clock signal. The reset signal is set to a high level in a reset condition of the SDRAM 1 and is set to a low level in other conditions of the SDRAM 1. 5 indicates an internal clock signal producing circuit of the first control circuit 3. In the internal clock signal producing circuit 5, the internal clock signal is produced from the internal clock enabling signal produced in the internal clock enabling signal producing circuit 6, the external clock signal, the first write recovery test signal and the external clock enabling signal. The external clock signal is input from the tester to the first control circuit 3. 4 indicates an internal write command signal and internal pre-charge signal producing circuit of the first control circuit 3. In the internal write command signal and internal pre-charge signal producing circuit 4, the internal write command signal and the first pre-charge signal are produced from the internal clock signal produced in the internal clock signal producing circuit 5, an external write command signal, the external clock signal and the first write recovery test signal. The external write command signal is set to a low level in a time-period (from a time T31 to a time T34 shown in FIG. 3) equal to the pulse repetition period of the external clock signal.

Also, 8 indicates a flip-flop of the second control circuit 7. In the flip-flop 8, the second pre-charge signal is produced from the first pre-charge signal produced in the internal write command signal and internal pre-charge signal producing circuit 4 and the internal clock signal produced in the internal clock signal producing circuit 5. 9 indicates a second selector of the second control circuit 7. In the second selector 9, the first pre-charge signal produced in the internal write command signal and internal pre-charge signal producing circuit 4 or the second pre-charge signal produced in the flip-flop 8 is selected according to a second write recovery test signal. The second write recovery test signal is set to a low level in cases where a write recovery time-period equal to ¼ or ½ of the pulse repetition period of the external clock signal is desired, and the first pre-charge signal is selected in the second selector 9. In contrast, the second write recovery test signal is set to a high-level in cases where a write recovery time-period equal to ¾ of the pulse repetition period of the external clock signal is desired, and the second pre-charge signal is selected in the second selector 9.

In the above configuration, an operation for preparing a write recovery time-period shorter than the pulse repetition period of the external clock signal in the test circuit 2 is described.

Figure 2:
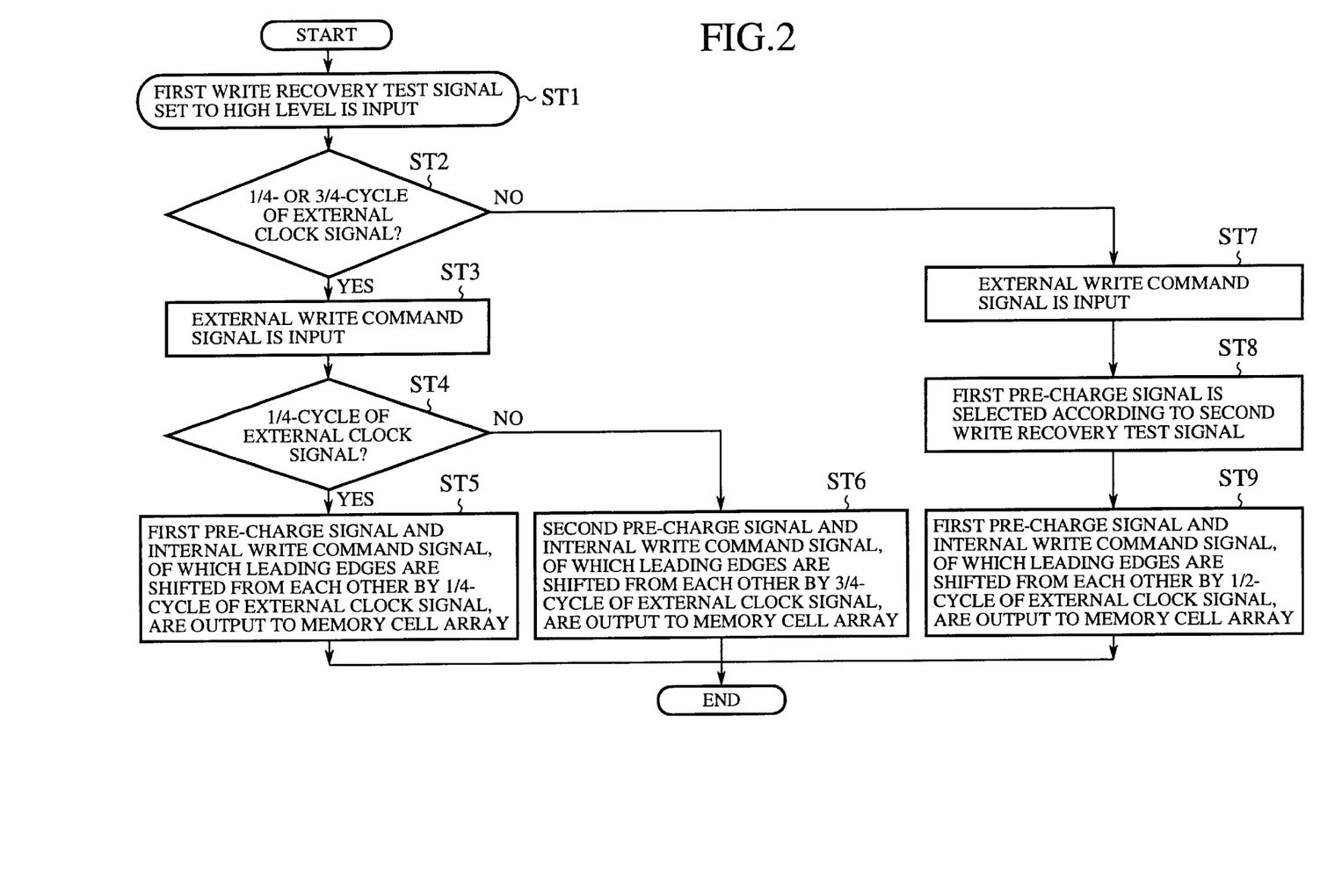
FIG. 2 is a flow chart showing an operation of a test circuit of the semiconductor memory shown in FIG. 1.
Figure 3:
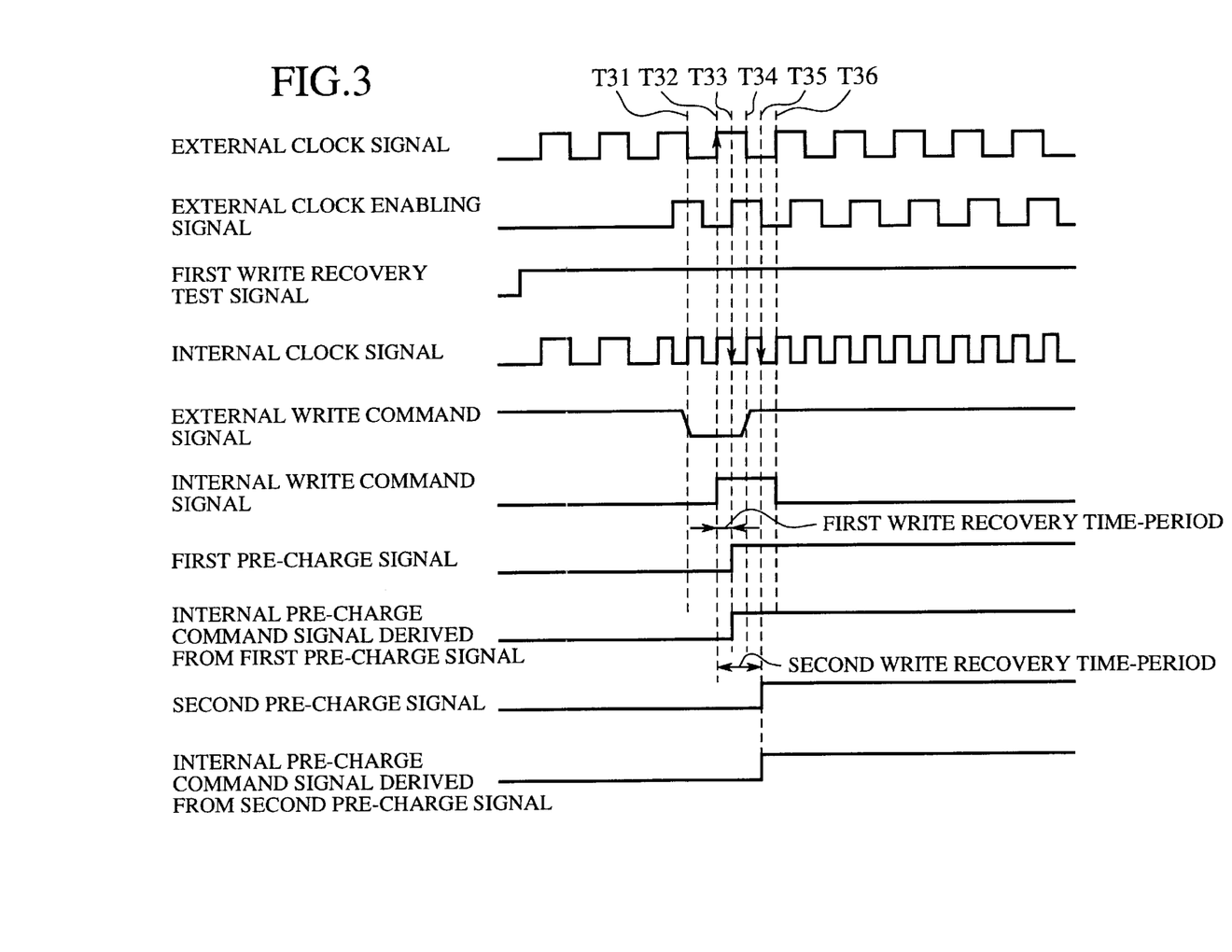
FIG. 3 is a timing chart of signals used in the test circuit to prepare a write recovery time-period, which is equal to ¼ or ¾ of the pulse repetition period of an external clock signal, according to the flow chart shown in FIG. 2.

FIG. 2 is a flow chart showing an operation of the test circuit 2 of the SDRAM 1 shown in FIG. 1, and FIG. 3 is a timing chart of signals used in the test circuit 2 to prepare a write recovery time-period, which is equal to ¼ or ¾ of the pulse repetition period of the external clock signal, according to the flow chart shown in FIG. 2.

A write recovery time-period, which is M/2N (N and M are respectively a positive integer, and 2N>M) of the pulse repetition period of the external clock signal, is prepared in the test circuit 2 and is provided for the memory cell array 11 to test an operational performance of the memory cell array 11 in the write recovery time-period.

The preparation of a write recovery time-period, which is equal to ¼ (M=1 and N=2) of the pulse repetition period of the external clock signal, is initially described.

As shown in FIG. 2 and FIG. 3, in a step ST1, an external clock signal is input from the tester to the internal write command signal and internal pre-charge signal producing circuit 4 and the internal clock signal producing circuit 5, and a first write recovery test signal set to the high level is input to the internal write command signal and internal pre-charge signal producing circuit 4, the internal clock signal producing circuit 5, the internal clock enabling signal producing circuit 6 and the first selector 10. When the first write recovery test signal set to the high level is input to the first control circuit 3, the internal write command signal and internal pre-charge signal producing circuit 4, the internal clock signal producing circuit 5 and the internal clock enabling signal producing circuit 6 are respectively set to an active state.

Thereafter, in a step ST2, it is judged by an operator or in a judging unit (not shown) whether or not a write recovery time-period, which is equal to ¼ or ¾ of the pulse repetition period of the external clock signal, is prepared in the test circuit 2. In cases where the preparation of a write recovery time-period, which is equal to ¼ or ¾ of the pulse repetition period of the external clock signal, is desired, an external clock enabling signal, of which the phase is shifted from that of the external clock signal by ¼ of the pulse repetition period of the external clock signal, is input to the internal clock signal producing circuit 5 and the internal clock enabling signal producing circuit 6 through the input pin, and a reset signal set to a high level is input to the internal clock enabling signal producing circuit 6. Therefore an internal clock signal, of which a pulse repetition period is half of that of the external clock signal, is produced in the internal clock signal producing circuit 5. The production of the internal clock signal is described in detail with reference to FIG. 3, FIG. 5 and FIG. 6.

Figure 6:
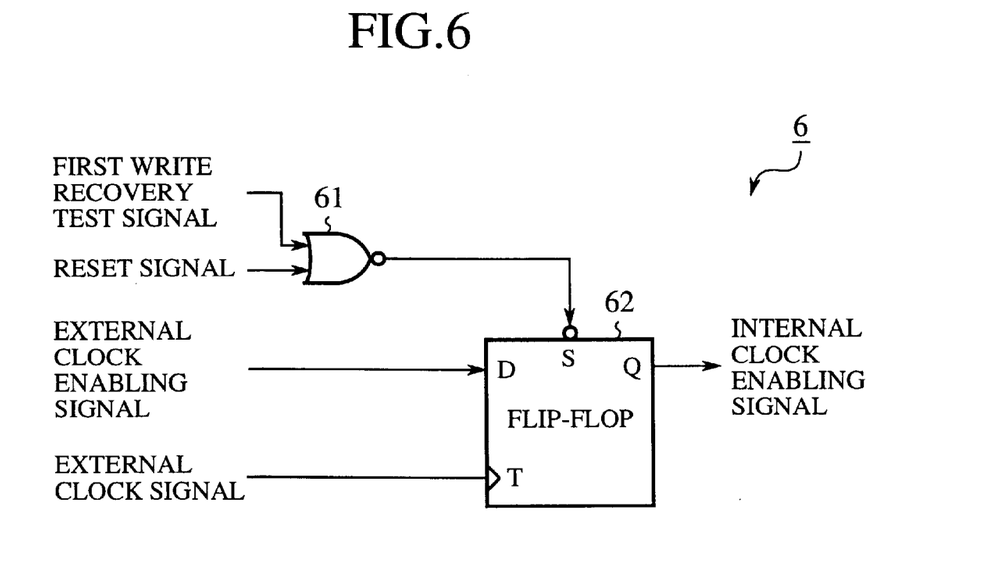
FIG. 6 is a circuit diagram of an internal clock enabling signal producing circuit of the test circuit of the semiconductor memory shown in FIG. 1.

FIG. 6 is a circuit diagram of the internal clock enabling signal producing circuit 6.

In FIG. 6, 61 indicates an NOR gate, and 62 indicates a positive edge trigger type flip-flop 62 (called a first flip-flop). When the first write recovery test signal set to the high level and the reset signal set to the high level are input to the NOR gate 61, an NOR gate signal set to a low level is output from the NOR gate 61 and is input to a set (S) terminal of the first flip-flop 62. Also, the external clock enabling signal is input to a D terminal of the first flip-flop 62, and the external clock signal is input to a T terminal of the first flip-flop 62. Because the NOR gate signal set to the low level is input to the S terminal of the first flip-flop 62, an internal clock enabling signal set to a high level is output from the first flip-flop 62 regardless of the external clock enabling signal and the external clock signal.

Figure 5:
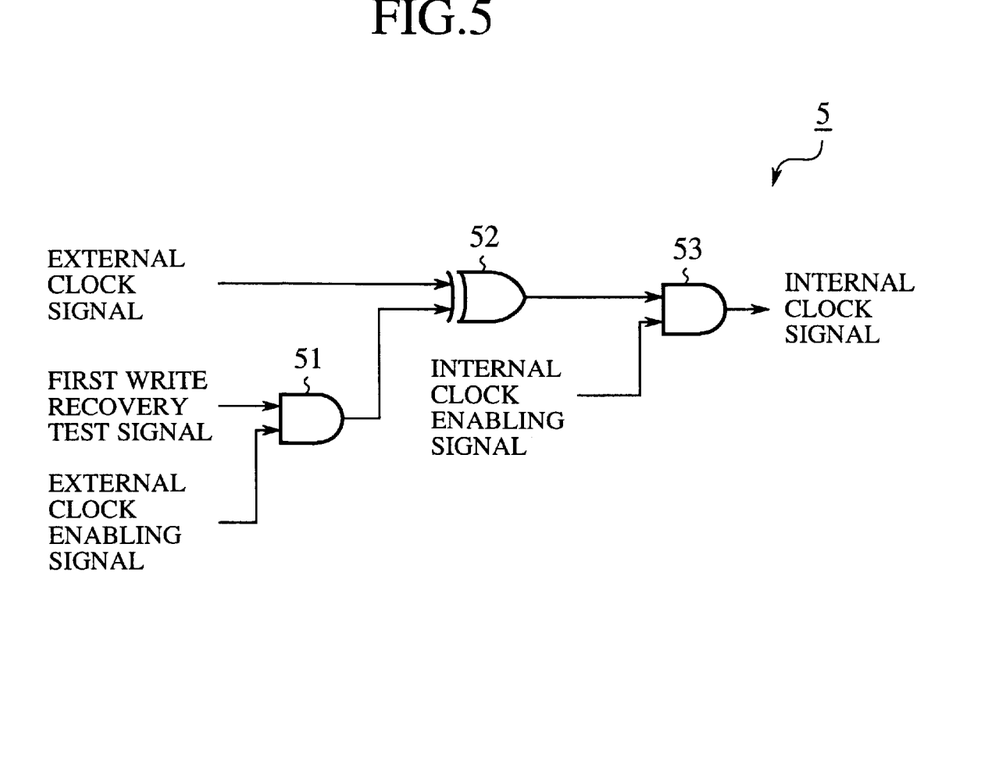
FIG. 5 is a circuit diagram of an internal clock signal producing circuit of the test circuit of the semiconductor memory shown in FIG. 1.

FIG. 5 is a circuit diagram of the internal clock signal producing circuit 5. In FIG. 5, 51 indicates a first AND gate, 52 indicates an EXOR (exclusive-or) gate, and 53 indicates a second AND gate. When the first write recovery test signal set to the high level and the external clock enabling signal are input to the first AND gate 51, a first AND gate signal, of which the phase is the same as that of the external clock enabling signal, is output from the first AND gate 51 and is input to the EXOR gate 52 with the external clock signal. Therefore, when the level of the first AND gate signal differs from that of the external clock signal, an EXOR gate signal is set to a high level in the EXOR gate 52. Also, when the level of the first AND gate signal is the same as that of the external clock signal, an EXOR gate signal is set to a low level in the EXOR gate 52. Thereafter the EXOR gate signal is output from the EXOR gate 52 and is input to the second AND gate 53 with the internal clock enabling signal. A pulse repetition period of the EXOR gate signal is half of that of the external clock signal. Thereafter, because the internal clock enabling signal is set to the high level, the internal clock signal, of which the phase is the same as that of the EXOR gate signal, is output from the second AND gate 53. Therefore, as shown in FIG. 3, the internal clock signal, of which a pulse repetition period is half of that of the external clock signal, is produced in the internal clock signal producing circuit 5 and is input to the internal write command signal and internal pre-charge signal producing circuit 4 and the flip-flop 8. In this case, because the inputting of the external clock enabling signal to the internal clock signal producing circuit 5 and the internal clock enabling signal producing circuit 6 is performed through the input pin which is used in a normal operation of the SDRAM 1, it is not required to additionally arrange a pin to input the external clock enabling signal in the wafer test performed by the test circuit 2.

Thereafter, in a step ST3, an external write command signal, of which a level is set to a low level in a time-period (from a time T31 to a time 34) equal to the pulse repetition period of the external clock signal, is input to the internal write command signal and internal pre-charge signal producing circuit 4. Therefore an internal write command signal, of which a level is set to a high level in a time-period (from a time T32 to a time 36) equal to the pulse repetition period of the external clock signal, is produced in the internal write command signal and internal pre-charge signal producing circuit 4. Also, a first pre-charge signal, of which a level is changed from a low level to a high level at a time T33, is produced in the internal write command signal and internal pre-charge signal producing circuit 4. The production of the internal write command signal and the first pre-charge signal is described in detail with reference to FIG. 7.

Figure 7:
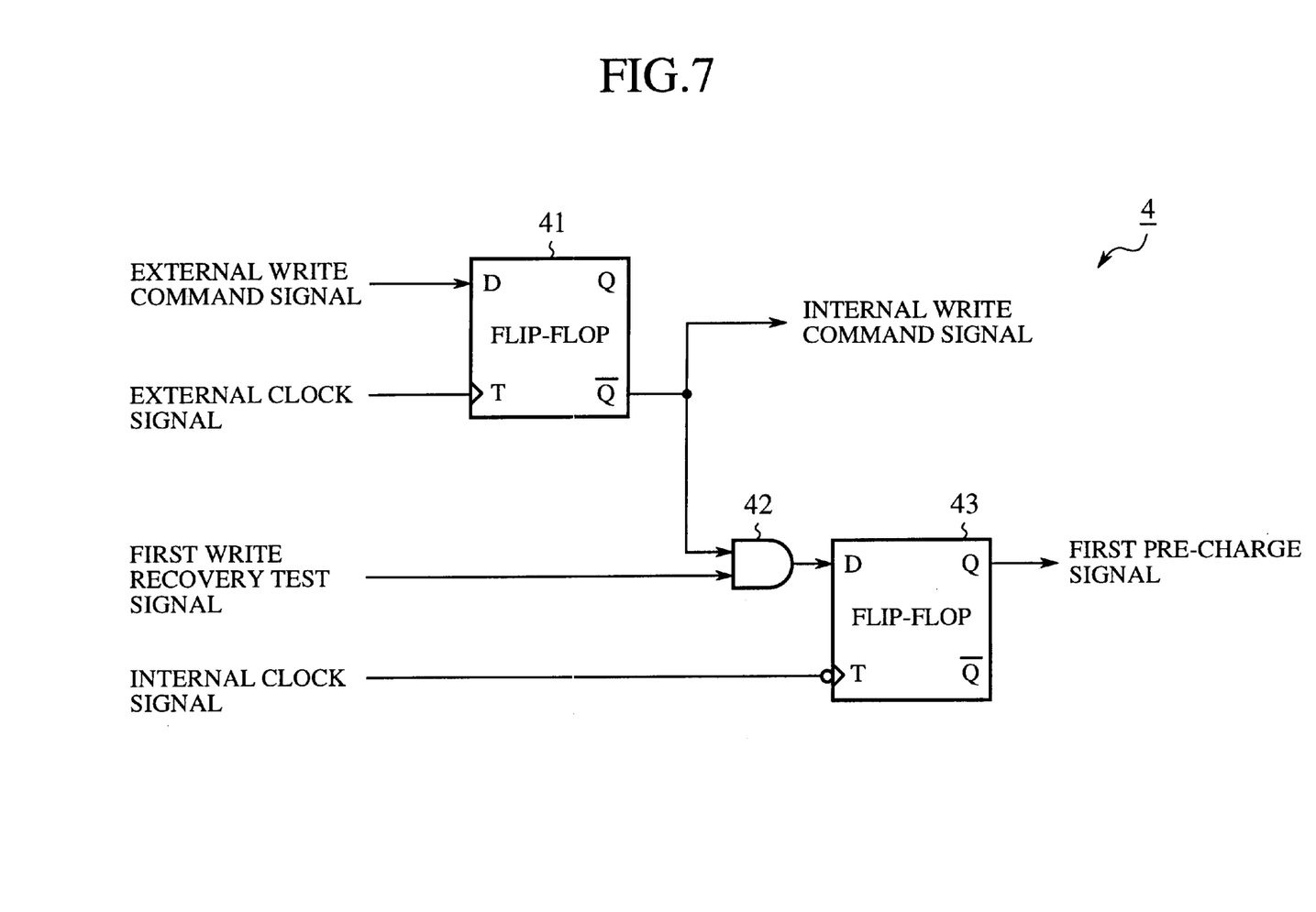
FIG. 7 is a circuit diagram of an internal write command signal and internal pre-charge signal producing circuit of the test circuit of the semiconductor memory shown in FIG. 1.

FIG. 7 is a circuit diagram of the internal write command signal and internal pre-charge signal producing circuit 4. In FIG. 7, 41 indicates a second positive edge trigger type flip-flop (called a second flip-flop), 42 indicates a third AND gate, and 43 indicates a negative edge trigger type flip-flop (called a third flip-flop). In the second flip-flop 41, the external write command signal is input to a D terminal, and the external clock signal is input to a T terminal. Therefore, as shown in FIG. 3, when the level of the external clock signal is risen up at the time T32 in the time-period in which the external write command signal is set to the low level, the level of the internal write command signal is changed from a low level to a high level. Also, when the level of the external clock signal is risen up at the time T36 in a time-period in which the external write command signal is set to the high level, the level of the internal write command signal is changed from the high level to the low level. Thereafter, the internal write command signal and the first write recovery test signal are input to the third AND gate 42. Because the first write recovery test signal is set to the high level, a third AND gate signal, of which the phase is the same as that of the internal write command signal, is output from the third AND gate 42 and is input to the third flip-flop 43 with the internal clock signal produced in the internal clock signal producing circuit 5. In the third flip-flop 43, when the level of the internal clock signal is fallen down at the time T33 in the time-period in which the internal write command signal is set to the high level, the level of the first pre-charge signal is changed from a low level to a high level. The leading edge of the first pre-charge signal at the time T33 is later than that of the internal write command signal at the time T32 by ¼ of the pulse repetition period of the external clock signal.

Thereafter the first pre-charge signal is input to the flip-flop 8 and the second selector 9 of the second control circuit 7. Thereafter a second pre-charge signal is produced from the first pre-charge signal and the internal clock signal in the flip-flop 8 and is output to the second selector 9.

Thereafter, in a step ST4, it is judged by the operator or in the judging unit whether or not a write recovery time-period, which is equal to ¼ of the pulse repetition period of the external clock signal, is prepared in the test circuit 2. In cases where the preparation of a write recovery time-period, which is equal to ¼ of the pulse repetition period of the external clock signal, is desired, a second write recovery test signal set to a low level is input to the second selector 9. Therefore the first pre-charge signal produced in the internal write command signal and internal pre-charge signal producing circuit 4 is selected in the second selector 9 according to the second write recovery test signal set to the low level.

Thereafter the first pre-charge signal is output from the second selector 9 and is input to the first selector 10. In the first selector 10, the first pre-charge signal is selected according to the first write recovery test signal set to the high level. Thereafter, in a step ST5, the first pre-charge signal is output from the first selector 10 to the memory cell array 11 as an internal pre-charge command signal, and the internal write command signal produced in the internal write command signal and internal pre-charge signal producing circuit 4 is input to the memory cell array 11.

Because the leading edge of the internal pre-charge command signal and the leading edge of the internal write command signal are shifted from each other by ¼ of the pulse repetition period of the external clock signal, a time-period extending from the time T32, at which the internal write command signal is changed to the high level, to the time T33, at which the internal pre-charge command signal derived from the first pre-charge signal is changed to the high level, is adopted as a first write recovery time-period (from the time T32 to the time T33), which is equal to ¼ cycle of the external clock signal, in the memory cell array 11. Therefore an operational performance of the memory cells arranged in the memory cell array 11 can be tested in the first write recovery time-period.

Next, the preparation of a write recovery time-period, which is equal to ¾ (M=3 and N=2) of the pulse repetition period of the external clock signal, is described.

After the step ST3 is performed, the first pre-charge signal produced in the internal write command signal and internal pre-charge signal producing circuit 4 is input to the flip-flop 8 and the second selector 9 of the second control circuit 7 in the same manner as in the operation for preparing the first write recovery time-period equal to ¼ of the pulse repetition period of the external clock signal. Thereafter a second pre-charge signal is produced in the flip-flop 8 according to the first pre-charge signal and the internal clock signal and is output to the second selector 9. More precisely, as shown in FIG. 3, when the level of the internal clock signal is fallen down at the time T35 in a time-period in which the first pre-charge signal is set to the high level, the second pre-charge signal, of which the level is changed from a low level to a high level, is produced in the flip-flop 8, and the second pre-charge signal is output from the flip-flop 8 and is input to the second selector 9. The leading edge of the second pre-charge signal at the time T35 is later than that of the internal write command signal at the time T32 by ¾ of the pulse repetition period of the external clock signal.

Thereafter it is judged in the step ST4 that the preparation of a write recovery time-period, which is equal to ¾ of the pulse repetition period of the external clock signal, is desired. Therefore a second write recovery test signal set to a high level is input to the second selector 9. In the second selector 9, the second pre-charge signal produced in the flip-flop 8 is selected according to the second write recovery test signal set to the high level. Thereafter, the second pre-charge signal is output from the second selector 9 and is input to the first selector 10. In the first selector 10, the second pre-charge signal is selected according to the first write recovery test signal set to the high level. Thereafter, in a step ST6, the second pre-charge signal is output from the first selector 10 to the memory cell array 11 as an internal pre-charge command signal, and the internal write command signal produced in the internal write command signal and internal pre-charge signal producing circuit 4 is input to the memory cell array 11.

Because the leading edge of the internal pre-charge command signal and the leading edge of the internal write command signal are shifted from each other by ¾ of the pulse repetition period of the external clock signal, a time-period extending from the time T32, at which the internal write command signal is changed to the high level, to the time T35, at which the internal pre-charge command signal derived from the second pre-charge signal is changed to the high level, is adopted as a second write recovery time-period (from the time T32 to the time T35), which is equal to ¾ of the pulse repetition period of the external clock signal, in the memory cell array 11. Therefore an operational performance of the memory cells arranged in the memory cell array 11 can be tested in the second write recovery time-period.

In the preparation of the first and second write recovery time-periods, the internal clock signal, of which the pulse repetition period is half of that of the external clock signal, is produced in the internal clock signal producing circuit 5 by shifting the phase of the external clock enabling signal from the phase of the external clock signal by ¼ of the pulse repetition period of the external clock signal. Therefore a time difference of the leading edges between the internal write command signal and the first pre-charge signal is equal to ¼ of the pulse repetition period of the external clock signal, and a time difference of the leading edges between the internal write command signal and the second pre-charge signal is equal to ¾ of the pulse repetition period of the external clock signal. Also, because the pulse repetition period of the internal clock signal can be easily set to 1/L (L is a positive integer higher than 1) of that of the external clock signal according to a well-known technique by shifting the phase of the external clock enabling signal from the phase of the external clock signal by ½L of the pulse repetition period of the external clock signal, a time difference of the leading edges between the internal write command signal and the internal pre-charge command signal can be easily set to M/2L (M is a positive integer, and M<2L) of the pulse repetition period of the external clock signal.

Next, the preparation of a write recovery time-period, which is equal to ½ (M=1 and N=1) of the pulse repetition period of the external clock signal, is described.

Figure 4:
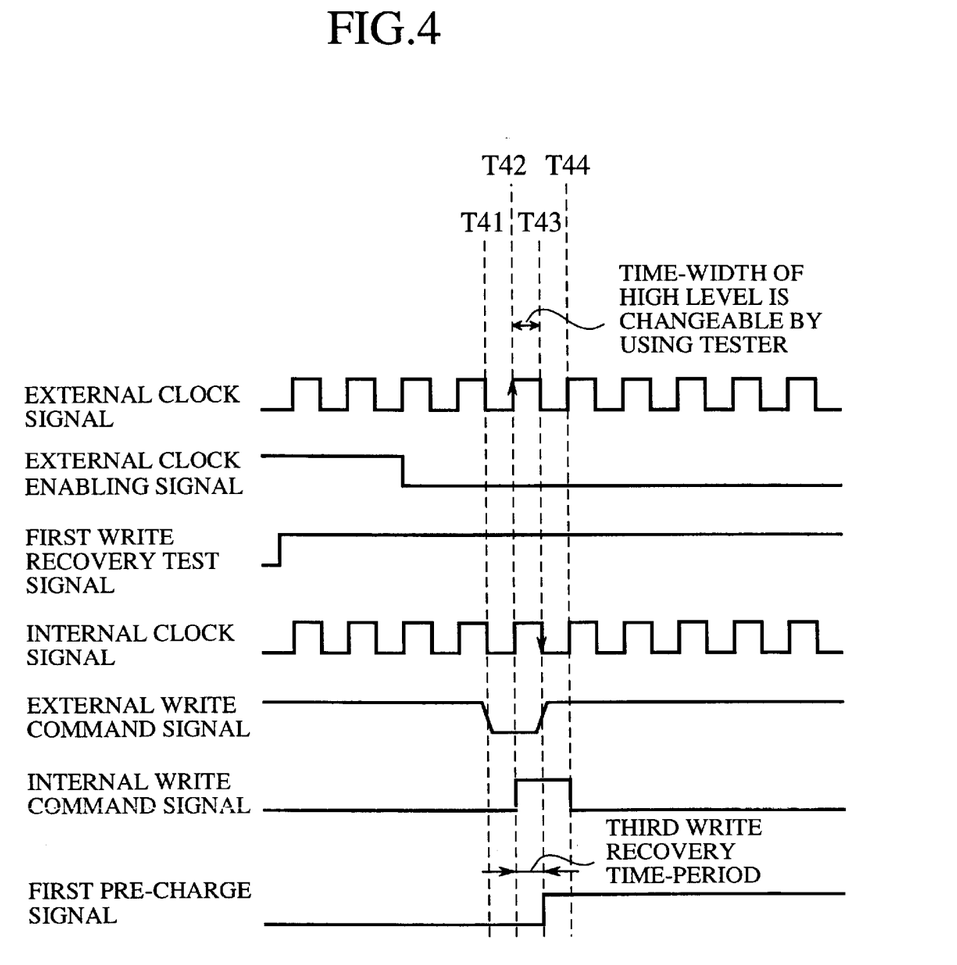
FIG. 4 is a timing chart of signals used in the test circuit to prepare a write recovery time-period, which is equal to ½ of the pulse repetition period of the external clock signal, according to the flow chart shown in FIG. 2.

FIG. 4 is a timing chart of signals used in the test circuit 2 to prepare a write recovery time-period, which is equal to ½ of the pulse repetition period of the external clock signal, according to the flow chart shown in FIG. 2.

As shown in FIG. 2, after the inputting of the first write recovery test signal is performed in the step ST1, it is judged in the step ST2 that a write recovery time-period, which is equal to ½ of the pulse repetition period of the external clock signal, is prepared in the test circuit 2. Therefore, as shown in FIG. 4, an external clock enabling signal set to a low level is input to the internal clock signal producing circuit 5 and the internal clock enabling signal producing circuit 6 through the input pin, a reset signal set to a high level is input to the internal clock enabling signal producing circuit 6, and a second write recovery test signal set to a low level is input to the second selector 9. Therefore an internal clock signal, of which the phase is the same as that of the external clock signal, is produced in the internal clock signal producing circuit 5. More precisely, as shown in FIG. 5 and FIG. 6, because the NOR gate signal set to the low level is input to the S terminal of the first flip-flop 62 in the same manner as in the preparation of the first or second write recovery time-period, an internal clock enabling signal set to a high level is output from the first flip-flop 62 and is input to the second AND gate 53. Because the first write recovery test signal set to the high level and the external clock enabling signal set to the low level are input to the first AND gate 51, a first AND gate signal set to a low level is output from the first AND gate 51 and is input to the EXOR gate 52 with the external clock signal. Because the first AND gate signal is set to the low level, an EXOR gate signal, of which the phase is the same as that of the external clock signal, is output from the EXOR gate 52 and is input to the second AND gate 53. Because the internal clock enabling signal input to the second AND gate 53 is set to the high level, the internal clock signal, of which the phase is the same as that of the external clock signal, is output from the second AND gate 53.

Thereafter, in a step ST7, as shown in FIG. 4, an external write command signal, of which a level is set to a low level in a time-period (from a time T41 to a time 43) equal to the pulse repetition period of the external clock signal, is input to the internal write command signal and internal pre-charge signal producing circuit 4. Therefore an internal write command signal, of which a level is set to a high level in a time-period (from a time T42 to a time 44) equal to the pulse repetition period of the external clock signal, is produced in the internal write command signal and internal pre-charge signal producing circuit 4. Also, a first pre-charge signal, of which a level is changed from a low level to a high level at a time T43, is produced in the internal write command signal and internal pre-charge signal producing circuit 4. The production of the internal write command signal and the first pre-charge signal is described in detail with reference to FIG. 7.

The external write command signal and the external clock signal are input to the second flip-flop 41. Therefore, as shown in FIG. 4, when the level of the external clock signal is risen up at the time T42 in the time-period in which the external write command signal is set to the low level, the level of the internal write command signal is changed from a low level to a high level. Also, when the level of the external clock signal is risen up at the time T44 in a time-period in which the external write command signal is set to the high level, the level of the internal write command signal is changed from the high level to the low level. Thereafter, in the same manner as in the preparation of the first and second write recovery time-periods, a third AND gate signal, of which the phase is the same as that of the internal write command signal, is output from the third AND gate 42 and is input to the third flip-flop 43 with the internal clock signal produced in the internal clock signal producing circuit 5. In the third flip-flop 43, when the level of the internal clock signal is fallen down at the time T43 in the time-period in which the internal write command signal is set to the high level, the level of the first pre-charge signal is changed from a low level to a high level. The leading edge of the first pre-charge signal at the time T43 is later than that of the internal write command signal at the time T42 by ½ of the pulse repetition period of the external clock signal. Thereafter the first pre-charge signal is input to the flip-flop 8 and the second selector 9 of the second control circuit 7. Thereafter a second pre-charge signal is produced from the first pre-charge signal and the internal clock signal in the flip-flop 8 and is output to the second selector 9.

Thereafter, in a step ST8, because the second write recovery test signal set to a low level is input to the second selector 9, the first pre-charge signal produced in the internal write command signal and internal pre-charge signal producing circuit 4 is selected in the second selector 9. Thereafter the first pre-charge signal is output from the second selector 9 and is input to the first selector 10. In the first selector 10, the first pre-charge signal is selected according to the first write recovery test signal set to the high level.

Thereafter, in a step ST9, the first pre-charge signal is output from the first selector 10 to the memory cell array 11 as an internal pre-charge command signal, and the internal write command signal produced in the internal write command signal and internal pre-charge signal producing circuit 4 is input to the memory cell array 11.

Because the leading edge of the internal pre-charge command signal and the leading edge of the internal write command signal are shifted from each other by ½ of the pulse repetition period of the external clock signal, a time-period extending from the time T42, at which the internal write command signal is changed to the high level, to the time T43, at which the internal pre-charge command signal derived from the first pre-charge signal is changed to the high level, is adopted as a third write recovery time-period (from the time T42 to the time T43), which is equal to ½ of the pulse repetition period of the external clock signal, in the memory cell array 11. Therefore an operational performance of the memory cells arranged in the memory cell array 11 can be tested in the third write recovery time-period.

In the preparation of the third write recovery time-period, the external clock enabling signal is fixed to the low level, and a time difference of the leading edges between the internal write command signal and the first pre-charge signal is set to ½ of the pulse repetition period of the external clock signal by fixing. Therefore, in addition to the time difference set to M/2L of the pulse repetition period of the external clock signal in the preparation of the first and second write recovery time-periods, a time difference of the leading edges between the internal write command signal and the internal pre-charge command signal can be easily set to M/2N (M and N are respectively a positive integer, and M<2N) of the pulse repetition period of the external clock signal.

Also, because a time-width (from the time T42 to the time T43) of the high level of the external clock signal can be easily adjusted in the tester according to a well-known technique, the third write recovery time-period is changeable. For example, the third write recovery time-period can be set to a specific time-period which is shorter than ½ of the pulse repetition period of the external clock signal and differs from M/2N of the pulse repetition period of the external clock signal.

Next, an normal operation of the SDRAM 1 is described in brief.

In cases where an normal operation of the SDRAM 1 is performed, the first write recovery test signal set to a low level is input to the first selector 10. Therefore a normal internal pre-charge command signal, which is used in the normal operation, is selected in the first selector 10 and is input to the memory cell array 11 as an internal pre-charge command signal. Also, the internal write command signal is produced from the external write command signal and the external clock signal in the internal write command signal and internal pre-charge signal producing circuit 4 and is input to the memory cell array 11. Therefore, a write operation and a pre-charge operation can be performed according to the internal write command signal and the internal pre-charge command signal in the memory cells arranged in the memory cell array 11.

In the operation of the test circuit 2, the first, second and third write recovery time-periods respectively shorter than the pulse repetition period of the external clock signal are prepared. However, it is applicable that a time-period relating to a row-to-column delay (tRCD) command be prepared in place of each of the first, second and third write recovery time-periods. The time-period relating to the tRCD command indicates a time-period from the inputting of a row type act command to a column type write or read command.

Also, it is applicable that an act command signal be used in place of the external write command signal and a test signal for producing an internal write command signal be used in place of the first write recovery test signal. In this case, even though an external clock signal having a comparatively long pulse repetition period is used in the test circuit 2, it can be judged whether or not an operational performance of the memory cell array 11 satisfies specifications required of the SDRAM 1.

Also, it is applicable that a test signal for producing a read command signal be used in place of the first write recovery test signal. In this case, an operational performance of the memory cell array 11 relating to the reading-out of data from the memory cell array 11 can be tested.

Also, the test circuit 2 of the semiconductor memory is applied to the SDRAM 1. However, the present invention is not limited to the test circuit 2 applied to the SDRAM 1. For example, the test circuit 2 can be applied to a circuit in which memories and logic units are mixed with each other. Also, the test circuit 2 can be applied to a logical circuit composed of logic elements.

Accordingly, in this embodiment, because the internal write command signal and the first pre-charge signal (or the second pre-charge signal) are produced by using the internal write command signal and internal pre-charge signal producing circuit 4, the internal clock signal producing circuit 5 and the internal clock enabling signal producing circuit 6, the first, second or third write recovery time-period shorter than the pulse repetition period of the external clock signal, can be used in the memory cell array 11 to test a write operation and a pre-charge operation in the first, second or third write recovery time-period. Therefore, even though the external clock signal having a pulse repetition period longer than that of a clock signal, which is actually used in a normal operation to operate a semiconductor memory represented by the SDRAM 1 while satisfying specifications required of the semiconductor memory, is used in the wafer test, the judgment whether or not an operational performance of the semiconductor memory satisfies the specifications can be reliably performed in the wafer test.

What is claimed is:

1. A test circuit of a semiconductor memory, comprising:

internal clock enabling signal producing means for producing an internal clock enabling signal set to a first level from a first write recovery test signal set to the first level and an external clock enabling signal, of which a phase is shifted from that of an external clock signal by ½L (L is a positive integer higher than 1) of a pulse repetition period of the external clock signal or which is set to a second level;

internal clock signal producing means for producing an internal clock signal, of which a pulse repetition period is 1/N (N is a positive integer, and N=L for the positive integer higher than 1) of the pulse repetition period of the external clock signal, from the internal clock enabling signal produced by the internal clock enabling signal producing means, the external clock signal, the first write recovery test signal set to the first level and the external clock enabling signal;

internal write command signal and internal pre-charge signal producing means for producing an internal write command signal and a first pre-charge signal, of which a leading edge is shifted from that of the internal write command signal by ½ N of the pulse repetition period of the external clock signal, from the internal clock signal produced by the internal clock signal producing means, an external write command signal set to the second level, the first write recovery test signal set to the first level and the external clock signal; and a first selector for outputting the first pre-charge signal produced by the internal write command signal and internal pre-charge signal producing means to a memory cell array as an internal pre-charge command signal to test an operational performance of the memory cell array according to a write recovery time-period which is determined from the internal pre-charge command signal and the internal write command signal produced by the internal write command signal and internal pre-charge signal producing means and is equal to ½N of the pulse repetition period of the external clock signal.

2. A test circuit of a semiconductor memory according to claim 1, wherein the internal clock signal producing means comprises:

a first AND gate for producing a first AND gate signal, of which the phase is the same as that of the external clock enabling signal, from the first write recovery test signal and the external clock enabling signal of which the phase is shifted from that of the external clock signal by ¼ of the pulse repetition period of the external clock signal or which is set to the second level;

an EXOR gate for producing an EXOR gate signal, of which a pulse repetition period is half of that of the external clock signal or of which the phase is the same as that of the external clock signal, from the first AND gate signal produced in the first AND gate and the external clock signal; and a second AND gate for producing the internal clock signal, of which a pulse repetition period is half of that of the external clock signal or of which the phase is the same as that of the external clock signal, from the EXOR gate signal produced in thev EXOR gate and the internal clock enabling signal.

3. A test circuit of a semiconductor memory according to claim 1, wherein the internal clock enabling signal producing means comprises:

an NOR gate for producing an NOR gate signal, which is set to the second level, from the first write recovery test signal and a reset signal; and a first flip-flop for receiving the NOR gate signal produced in the NOR gate as a set signal and producing the internal clock enabling signal, which is set to the first level, from the set signal, the external clock enabling signal and the external clock signal.

4. A test circuit of a semiconductor memory according to claim 1, wherein the internal write command signal and internal pre-charge signal producing means comprises:

a second flip-flop for producing the internal write command signal from the external write command and the external clock signal;

a third AND gate for producing a third AND gate signal from the internal write command signal produced in the second flip-flop and the first write recovery test signal set to the first level; and a third flip-flop for producing the first pre-charge signal from the third AND gate signal produced in the third AND gate and the internal clock signal.

5. A test circuit of a semiconductor memory according to claim 1, further comprising:

second control means for producing a second pre-charge signal, of which a leading edge is shifted from that of the internal write command signal by K/2N (K is a positive integer high than 1, and K<2N) of the pulse repetition period of the external clock signal, from the internal clock signal produced by the internal clock signal producing means and the first pre-charge signal produced by the internal write command signal and internal pre-charge signal producing means, wherein the first selector selects either the first pre-charge signal or the second pre-charge signal as the internal pre-charge command signal to test the operational performance of the memory cell array according to a write recovery time-period which is determined from the internal pre-charge command signal and the internal write command signal produced by the internal write command signal and internal pre-charge signal producing means and is equal to M/2N (M is a positive integer, and M<2N) of the pulse repetition period of the external clock signal.

6. A test circuit of a semiconductor memory according to claim 5, wherein the second control means comprises:

a flip-flop for producing the second pre-charge signal, of which a leading edge is shifted from that of the internal write command signal by ¾ of the pulse repetition period of the external clock signal, from the internal clock signal, of which a pulse repetition period is half of that of the external clock signal, and the first pre-charge signal of which a leading edge is shifted from that of the internal write command signal by ¼ of the pulse repetition period of the external clock signal; and a second selector for selecting either the first pre-charge signal produced by the internal write command signal and internal pre-charge signal producing means or the second pre-charge signal produced in the flip-flop according to a second write recovery test signal, wherein the first selector selects the first pre-charge signal or the second pre-charge signal selected in the second selector as the internal pre-charge command signal according to the first write recovery test signal to test the operational performance of the memory cell array according to a write recovery time-period which is determined from the internal pre-charge command signal and the internal write command signal produced by the internal write command signal and internal pre-charge signal producing means and is equal to ¼ or ¾ of the pulse repetition period of the external clock signal.

7. A test circuit of a semiconductor memory according to claim 1, wherein the internal clock signal, of which the phase is the same as that of the external clock signal, is produced by the internal clock signal producing means in cases where the external clock enabling signal set to the second level is input to the internal clock signal producing means, the level of the internal write command signal produced by the internal write command signal and internal pre-charge signal producing means is risen up in synchronization with a leading edge of the external clock signal, the level of the first pre-charge signal produced by the internal write command signal and internal pre-charge signal producing means is risen up in synchronization with a trailing edge of the internal clock signal to set a time difference in the leading edges between the first pre-charge signal and the internal write command signal to ½ of the pulse repetition period of the external clock signal, and the operational performance of the memory cell array is tested according to the write recovery time-period equal to ½ of the pulse repetition period of the external clock signal.

\* \* \* \* \*